United States Patent
Okawa

(10) Patent No.: US 7,217,638 B2
(45) Date of Patent: May 15, 2007

(54) WAFER BACK SURFACE TREATING METHOD AND DICING SHEET ADHERING APPARATUS

(75) Inventor: Yuji Okawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 206 days.

(21) Appl. No.: 10/809,566

(22) Filed: Mar. 25, 2004

(65) Prior Publication Data

US 2004/0242002 A1    Dec. 2, 2004

(30) Foreign Application Priority Data

May 29, 2003   (JP) .............................. 2003-152344

(51) Int. Cl.
*H01L 21/30* (2006.01)
*H01L 21/46* (2006.01)

(52) U.S. Cl. ...................................... 438/458; 438/465
(58) Field of Classification Search ................ 438/458, 438/464–465, 459, 692, 697; 427/561, 98.6
See application file for complete search history.

(56) References Cited

U.S. PATENT DOCUMENTS

| | | | | |
|---|---|---|---|---|
| 5,851,664 A | * | 12/1998 | Bennett et al. | ....... 428/355 BL |
| 6,812,064 B2 | * | 11/2004 | Jiang et al. | .................. 438/118 |
| 2002/0004288 A1 | * | 1/2002 | Nishiyama | .................. 438/464 |

FOREIGN PATENT DOCUMENTS

JP         2003-7646        1/2003

* cited by examiner

*Primary Examiner*—Thanhha S. Pham
(74) *Attorney, Agent, or Firm*—Knobbe Martens Olson & Bear LLP

(57) ABSTRACT

Provided is a treatment method of a semiconductor wafer facilitating picking-up of semiconductor chips and preventing contamination by a dicing sheet. A wafer back surface treating method is characterized in that a ground or polished surface of a semiconductor wafer activated in a grinding or polishing step, with semiconductor circuits formed thereon, is deactivated. In the method, the activation treatment with an oxidizing agent is preferable. Furthermore, the activation treatment is preferably implemented with blowing of ozone to a ground or polished surface of a wafer, with ozone water or with illumination of a ground or polished surface of a wafer with ultraviolet (UV). It is preferable to adhere a dicing sheet after the deactivation treatment.

2 Claims, 3 Drawing Sheets

WAFER BACK SURFACE TREATING METHOD AND DICING SHEET ADHERING APPARATUS

BACKGROUND OF THE INVENTION

1. Field of the Invention

The invention relates to a treatment method of a semiconductor wafer (hereinafter referred to as wafer), which is especially useful as a treatment method applied to a process including a step of adhering a dicing sheet to the wafer, following a grinding step for thinning the wafer (or one of various kinds of polishing steps) after circuits are formed on the wafer; and to an apparatus using the treatment method of the wafer.

2. Prior Art

A semiconductor wafer made of silicon, gallium, arsenide or the like has been conventionally used in a way such that circuits are formed on the wafer, thereafter a grinding step for thinning the wafer is applied thereto, then a dicing sheet is adhered thereto and the wafer with the sheet is then diced into small device pieces, followed by a mounting step (see, for example, JP-A No. 2003-7646). In such a process, since steps including as far as polishing or back grinding of a back surface of a wafer after a pattern forming process thereon have been regarded as the front-end process in semiconductor fabrication, the back grinding step is separated from a step of adhering a dicing sheet to the back surface of a wafer; therefore, it has been common that one day or longer passes till the dicing sheet is adhered to the wafer after the end of polishing or back grinding.

The wafer polishing step, however, has been regarded as the back-end process in recent years. And a dicing sheet is adhered within a few hours of the end of polishing, or alternatively, a process from a wafer polishing apparatus to the dicing sheet adhering apparatus is integrated into a single system; therefore, cases increase where a dicing sheet is adhered to the wafer immediately after the end of polishing.

In a case where, in this way, a dicing sheet is adhered to a wafer a few hours after the end of polishing, or a process from a wafer polishing apparatus to a dicing sheet adhering apparatus is integrated into a single system, so a dicing sheet is adhered to the wafer immediately after the end of polishing, a sticking force between the dicing sheet and the back surface of a wafer increases, which has led to a possibility to cause a problem that when semiconductor chips obtained by being separated into small pieces are picked up after the dicing step, the picking-up is disabled or contamination by the dicing sheet is severe even if the picking-up is enabled.

SUMMARY OF THE INVENTION

The invention has been made with attention given to such circumstances. It is an object of the invention to provide a treatment method and an apparatus therefore capable of manufacturing semiconductor parts without disabling picking-up of semiconductor chips after dicing the wafer, or rendering a wafer severely contaminated by a dicing sheet even if the picking-up is enabled, which is caused to increase in sticking force between the dicing sheet and a back surface of a wafer.

The inventors have conducted a serious study on a wafer dicing step after a grinding step with the result of a finding that the above object can be achieved by means of the following methods, which has led to the invention.

That is, the invention is a wafer back surface treating method in which a ground or polished surface of a semiconductor wafer activated in a grinding or polishing step, with semiconductor circuits formed thereon, is deactivated. With such a treatment applied, a sticking force between a dicing sheet and a back surface of a wafer is reduced, thereby enabling picking-up of semiconductor chips to be facilitated and in addition, contamination by the dicing sheet to be prevented.

In the method, the deactivation treatment is preferably implemented with an oxidizing agent. An oxidation treatment with an oxidizing agent can stabilize and deactivate an unstable back surface of a wafer, which is produced in grinding or polishing, in an arbitrary condition.

The deactivation treatment is preferably implemented with blowing of ozone to a ground or polished surface of a wafer. With the blowing of ozone applied, an oxidation treatment of the ground or polished surface of a wafer can be rapidly and uniformly performed in a dry condition.

The deactivation treatment is preferably implemented with ozone water. With the treatment using ozone water applied, an oxidation treatment on ground or polished surfaces of plural wafers can be uniformly performed. A cleaning effect by ozone water is also exerted and the treatment also works as a cleaning step.

The deactivation treatment is preferably implemented with illumination of a ground or polished surface of a wafer with ultraviolet rays (UV). With UV illumination applied, an oxidation treatment on the ground or polished surface of a wafer can be mildly and uniformly performed in a dry condition.

It is preferable to adhere a dicing sheet after the deactivation treatment. With an above described treatment applied, a dicing sheet is adhered to a back surface of the wafer in a state with a reduced sticking force between the dicing sheet and the back surface of a wafer, which makes it possible to provide a treatment method of semiconductor parts facilitating picking-up of semiconductor chips and in addition, preventing contamination by a dicing sheet.

The invention is a dicing sheet adhering apparatus having a mechanism to blow ozone to a ground or polished surface of a wafer. In a state where an oxidation treatment with ozone is applied to reduce a sticking force between a dicing sheet and a back surface of a wafer, the dicing sheet is adhered to the back surface of a wafer, which makes it possible to provide a treatment apparatus of semiconductor parts facilitating picking-up of semiconductor chips and preventing contamination by the dicing sheet. With blowing of ozone, an oxidation treatment on a ground or polished surface of a wafer can be rapidly and uniformly performed in a dry condition.

The dicing sheet adhering apparatus preferably has a UV illumination mechanism illuminating a UV-setting protective tape on a ground or polished surface of a wafer and in addition, a mechanism to blow the exhaust gas having cooled a UV lamp to the ground or polished surface of a wafer. By blowing the exhaust gas having cooled the UV lamp to a ground or polished surface of a wafer in this way, it is made possible to apply an oxidation treatment on a ground or polished surface of a wafer with ozone without using an additional ozone generator, where ozone is blown to the ground or polished surface of a wafer for a predetermined time, thereby enabling a very mild deactivation treatment to be effected.

DESCRIPTION OF THE PREFERRED EMBODIMENTS

Figure 1:
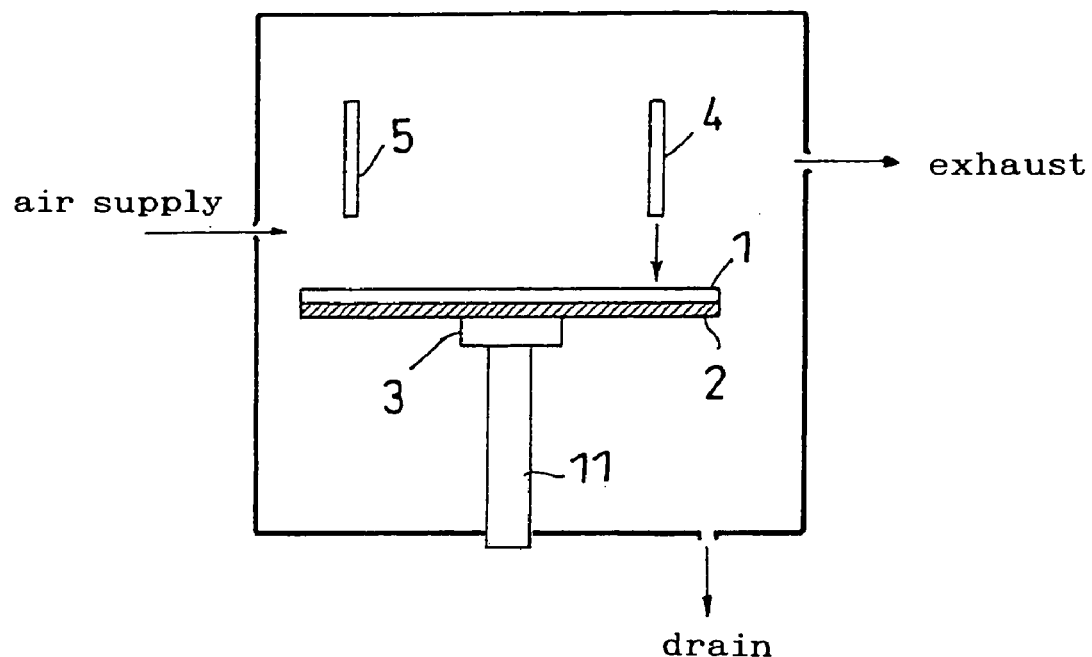
FIG. 1 is a descriptive view showing a first example construction of a dicing sheet adhering apparatus of the invention.

Description will be given of embodiments of the invention below.

The invention is a treatment method of a back surface of a wafer having a feature that a deactivation treatment is applied to a ground or polished surface of a semiconductor wafer with semiconductor circuits formed thereon, activated in a grinding or polishing step. The inventor has found that deactivation of a ground or polished surface of a wafer activated in a grinding or polishing step is a treatment method that is very effective for reduction in sticking force between a dicing sheet and a back surface of a wafer, based on the knowledge and findings that, in a dicing step, reduction in sticking force between the dicing sheet and the back surface of a wafer in advance makes it possible to facilitate picking-up of semiconductor chips and to prevent contamination by the dicing sheet. Therefore, a dicing step and subsequent steps thereof can be smoothly advanced without requiring either addition of a step or a modification in an existing step, which is significant.

That is, the invention is to oxidize an unstable back surface of a wafer produced in grinding or polishing with ozone or the like described later and to thereby achieve stabilization of the surface of a wafer. The term, unstable surface of a wafer, here, expresses a surface rich in states, metallic, monovalent, divalent and/or trivalent, but poor in a state of $SiO_2$ (tetravalent Si), which is a natural oxide film.

The deactivation treatment is preferably implemented with an oxidizing agent. Since it has been found by the inventor that an oxidation treatment with an oxidizing agent is effective for stabilization of an unstable back surface of a wafer produced in grinding or polishing, such a treatment reduces a sticking force between a dicing sheet and a back surface of a wafer, thereby enabling picking-up of semiconductor chips to be facilitated and in addition, contamination by a dicing sheet to be prevented.

As agents used for implementing a deactivation treatment, hydrogen peroxide water is preferably used because of cleanliness thereof and simplicity and convenience of cleaning after the deactivation treatment.

Hydrogen peroxide water is employed usually as a solution with a concentration of the order of 3% thereof. Note that with an additional step dedicated only to cleaning provided, other oxidizing agents can be employed and it is possible to also use a great amount of air, which is poor in efficiency. By arbitrarily selecting a kind of an oxidizing agent and an oxidation condition, a back surface of a wafer can be stabilized and deactivated in an optimal condition.

The deactivation treatment is preferably to be implemented by blowing of ozone to a ground or polishing surface of a wafer. Since it has been found by the inventor that in an oxidation treatment on a ground or polished surface of a wafer, wherein an oxidizing ability of ozone is utilized, blowing of ozone realizes the oxidation rapidly and uniformly, the blowing of ozone is effective, additionally because of being enabled in a dry condition. In a case where an ozone blowing treatment is applied in a cleaning step after grinding or polishing a wafer, not only can ozone be dispersed by the cleaning wafer, but an effect of removing the cleaning water can also be attained. An ozone concentration can also be altered and a deactivation treatment can be carried out in an optimal condition for a grinding or polishing method.

Ozone employed can be produced by a common ozone generator. Blowing after cleaning can be implemented with an exhaust apparatus equipped to a grinding or polishing apparatus. The oxidation treatment with ozone can be performed in any of the following independent steps after a grinding or polishing step: (1) a step of applying blowing of ozone to each cassette, (2) a step of applying blowing of ozone to each wafer one at a time, (3) a step of substituting the atmosphere in a closed vessel having wafers therein with an ozone containing atmosphere, and (4) a step of blowing with an exhaust apparatus equipped to a dicing tape adhering apparatus. An ozone concentration used in the treatment is preferably in the range of from 0.1 through 10 ppm in consideration of a wafer preparing process, though ozone concentrations of the order in the range of from 0.1 through 10000 ppm can be obtained from an ozone generator as its capability.

Note that in the invention, no special limitation is placed on a source of ozone and for example, in a case where a UV illumination mechanism for a UV-setting protective tape is equipped, as described later, part of oxygen in cooling air is converted to ozone by a UV lamp, so a deactivation treatment can be implemented by blowing the exhaust having used in the cooling of UV lamp to a ground or polished surface of a wafer for a predetermined time.

The activation treatment is preferably a treatment with ozone water. An oxidation treatment on a ground or polished surface of a wafer is performed not with ozone in a dry state but with ozone water in a wet state, which enables oxidation rapidly and uniformly. A treatment method can be, to be concrete, spraying of ozone water to a wafer or immersion of a wafer in ozone water. A treatment with ozone water has a cleaning effect and thereby, can work as a cleaning step as well as an oxidation step, and in a case of an immersion method, the method is excellent in that plural wafers can be treated at a time.

Ozone water employed can be produced by a common ozone water producing apparatus, and ozone water can be used as cleaning water, as it is, in a grinding or polishing apparatus. Alternatively, it is possible that wafers are immersed in ozone water in a state of being housed in a cassette, individually immersed in ozone water one at a time in an additional step after a grinding or polishing step, or sprayed with ozone water either individually or in a group. In a case where ozone water is also used as cooling water during grinding of a wafer or wafers, more of effects can be exerted. An ozone concentration in ozone water is preferably in the range of about 3 through 15 ppm.

The deactivation treatment is preferably UV illumination of a ground or polished surface of a wafer. Since with not only a direct treatment effect of ozone converted from oxygen at a surface of a wafer by UV illumination of a wafer, but also an indirect blowing effect of ozone converted from oxygen in the neighborhood by UV, which can be exerted, UV illumination can be effected over a wide range with uniformity, so an oxidation treatment on a ground or polished surface of a wafer can be uniformly performed in a dry condition. Furthermore, since a UV intensity can also be altered, a deactivation treatment can be effected in an optimal condition in a grinding or polishing method. Especially in a case where in a drying step after cleaning, dry air is blown to a wafer, the effect of UV illumination can be more effectively exerted.

While the plural deactivation treatments are exemplified in the above description, the treatments are generally implemented alone. However, the treatments can be used in combination, some but not all, and by applying methods in combination sequentially, deactivation can be implemented uniformly and stably. For example, there can be cited a method in which cleaning and the first deactivation treatment are conducted by immersion in ozone water, followed by drying and the final deactivation treatment effected by blowing of ozone.

A dicing sheet is preferably adhered to a wafer after a deactivation treatment described above. In the invention, by adhering a dicing sheet to a ground or polished surface of a semiconductor wafer after a deactivation treatment applied on the ground or polished surface thereof activated in a grinding or polishing step, dicing can be conducted in a state where a sticking force therebetween is reduced. Accordingly, there can be provided a treatment method of semiconductor parts in which picking-up of semiconductor chips to which a dicing sheet is adhered is facilitated and contamination by the dicing sheet is prevented.

The invention is a dicing sheet adhering apparatus with a feature of having a mechanism blowing ozone to a ground or polished surface of a wafer. An oxidation treatment with ozone, as described above, can exert an effect excellent in that picking-up of semiconductor chips is facilitated and contamination by a dicing sheet is prevented. Therefore, with such a mechanism equipped to a dicing sheet adhering apparatus, an apparatus capable of conducting treatments on semiconductor parts can be provided. Some of concrete constructions will be exemplified in examples described later.

The dicing sheet adhering apparatus preferably has a UW illumination mechanism for illuminating a UV-setting protective tape in a ground or polished surface of a wafer and a mechanism to blow exhaust having cooled the UV lamp to the grounded or polished surface of a wafer. This dicing sheet adhering apparatus has a feature of blowing heated air generated in a UV illumination apparatus included in the dicing sheet adhering apparatus, to thus blow exhaust having cooled a UV lamp (the exhaust is hereinafter referred to as UV illumination mechanism exhaust) without using an additional ozone generator, to thereby make it possible an oxidation treatment on a ground or polished surface with ozone, and to enable a deactivation treatment to be very mildly effected by blowing for a predetermined time. Since, to be concrete, ozone in the air is very small in content and an effect thereof is very limited, it is preferable to leave a wafer in the air in a period at least from 2 through 6 hr after grinding or polishing.

While description is given of the treatments on a surface of a wafer which is an object to be adhered, it is preferable to apply a predetermined treatment on a dicing sheet in addition to an above treatment on the surface of a wafer. A dicing sheet is normally to be removed from a wafer after completion of dicing. So it is preferable to decrease an adhesion to a dicing sheet of a surface of a wafer, which is an object to be adhered as well as to decrease a sticking force of the dicing sheet. With a better balance between the wafer and the sheet in adhesiveness, an advantage is established in that adherence or removal of a sheet can be stably performed.

For example, there is cited a method in which a UV treatment is applied on a surface of a UV-setting adhesive sheet in advance. With a UV treatment applied, an adhesive is cured a little, thereby enabling reduction in sticking force. There is cited a method in which a sheet surface is subjected to a foaming treatment. With a foaming treatment applied on the sheet surface, a contact area with a wafer decreases to thereby enable a sticking force therebetween to be reduced. Furthermore, there is cited a method in which jaggedness in a wavy state or in a square matrix are formed on a sheet surface. With the jaggedness formed on a sheet surface, a contact area with a wafer decreases to thereby enable a sticking force to be reduced.

EXAMPLES

Description will be given of examples and the like showing a construction and effect of the invention in a concrete manner below. Measurement on an evaluation item in the examples and the like was conducted as follows. Note that needless to say that the invention is not limited to the examples and the evaluation methods.

<Evaluation Method>

In order to evaluate an effect of a deactivation treatment, wafers each were ground to a thickness of 400 μm with Back Grinder DFG-840 manufactured by DISCO Inc., a deactivation treatment was applied to the wafers and UV-setting adhesive sheets prepared separately were adhered to the wafers within 1 hr of the deactivation treatment. One of the wafers was illuminated with UV 30 min after adherence of the sheet with UV illuminating apparatus UM-810 manufactured by Nitto Denko Corporation and a UV-setting adhesive sheet was adhered on only one of the wafers subjected to a treatment with UV illumination mechanism exhaust 3 hr after the deactivation treatment. Measurement of a sticking force was conducted on the wafers treated as described above. In the deactivation treatment, gases other than the UV illumination mechanism exhaust were all blown to wafers at a flow rate of 1 L/min. Only of the UV illumination mechanism exhaust was blown to a wafer at a flow rate of 3 L/min. One wafer was diced with Dicer DFD-651 manufactured by DISCO Co. into pieces each of 5 mm×7 mm and UV illumination was applied to the pieces with UV illuminating apparatus UM-810 manufactured by Nitto Denko Corporation, followed by a picking-up evaluation.

(1) Measurement of Sticking Force

A releasing force of an adhesive tape was measured at a pulling angle of 15 degrees with a pulling tester in which the pulling angle is arbitrarily adjustable and can keep at a constant value.

(2) Evaluation of Picking-Up

Picking-up was conducted in conditions of 4 pins and a plunge-up of 500 μm with Dibonder CPS-100 manufactured by NEC Machinery Co., Ltd.

<Preparation of Evaluation Sheet>

A UV-setting adhesive sheet for evaluation was prepared as follows:

A mixed composition including 70 parts by wt of methyl acrylate, 30 parts by wt of butyl acrylate and 5 parts of by wt of acrylic acid were copolymerized to obtain an acryl-based copolymer with a number-average molecular weight of 800,000. Added to a solution of the copolymer were 70 parts by wt of dipentaerythritolhexaacrylate (manufactured by NIPPON KAYAKU CO., LTD. with a trade name of KAYARAD DPHA), 5 parts by wt of a radical polymerization initiator (manufactured by Chiba Specialty Chemicals Inc., with a trade name of Irgacure 651), and a polyisocyanate compound (manufactured by NIPPON POLYURETHANE INDUSTRY CO., LTD. with a trade name of CORONATE L) to prepare an acryl-based UV-setting adhesive solution. The solution was applied to one corona treated surface of a polyethylene film with a thickness of 80 μm and the polyethylene film with a coat was dried by heating to form a UV-setting adhesive layer thereon of a thickness of 10 μm. Then, a separator was adhered to the surface of the adhesive layer to obtain a UV-setting adhesive sheet. The separator used here was a polyester film (manufactured by Toray Industries Inc., with a trade name of Lumirror S-10#50) with a thickness of 38 μm applied with a releasing agent that is adhered to an adhesive layer adhering surface.

Description will be given of Examples 1 through 6, which are embodiments of the inventions, and Comparative Example below with the reference to accompanying drawings.

Example 1

FIG. 1 is an example of a wafer back surface cleaning section of a grinding or polishing apparatus related to the invention. In FIG. 1, a wafer 1, in a state where a back grinding tape 2 remains stuck thereon, is fixed on a rotary shaft 11 by vacuum suction with a suction pad 3 interposed therebetween and cleaned with a cleaning water spraying nozzle 5 while being rotated about the rotary shaft 11, and thereafter, removal of water and a deactivation treatment by ozone are simultaneously performed with an ozone blowing nozzle 4. Ozone is produced by an ozone generator provided separately. An ozone concentration is preferably in the range of from 0.1 through 10 ppm in consideration of a time necessary for reduction in ozone concentration when the apparatus is opened. Exhaust is effected by a common exhaust means such as a blower or the like. The wafer is unloaded through a wafer take-out port by a robot arm having a wafer sucking means after an ozone concentration is reduced to 0.1 ppm or less while air is supplied through an air supply port and housed into a predetermined cassette.

Example 2

Figure 2:
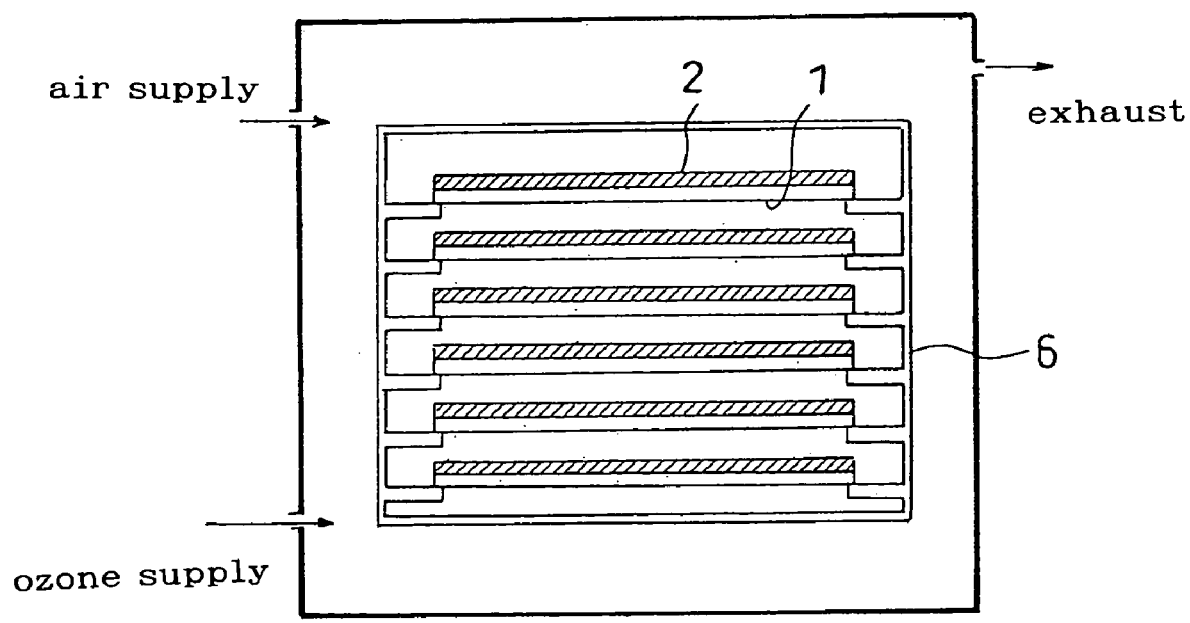
FIG. 2 is a descriptive view showing a second example construction of the dicing sheet adhering apparatus of the invention.

FIG. 2 is an example of a treatment by ozone of a wafer cassette related to the invention. In FIG. 2, wafers 1 are housed in a wafer cassette 6, each being in a state where the back grinding tape 2 remains stuck thereon. The wafer cassette 6 is placed in a vessel having an ozone supply section and an exhaust section. Wafers 1 are subjected to a deactivation treatment in the condition similar in Example 1. The cassette is taken out from the closed vessel, opening the top portion thereof after an ozone concentration is reduced through 0.1 ppm or less while air is supplied through an air supply port.

Example 3

Figure 3:
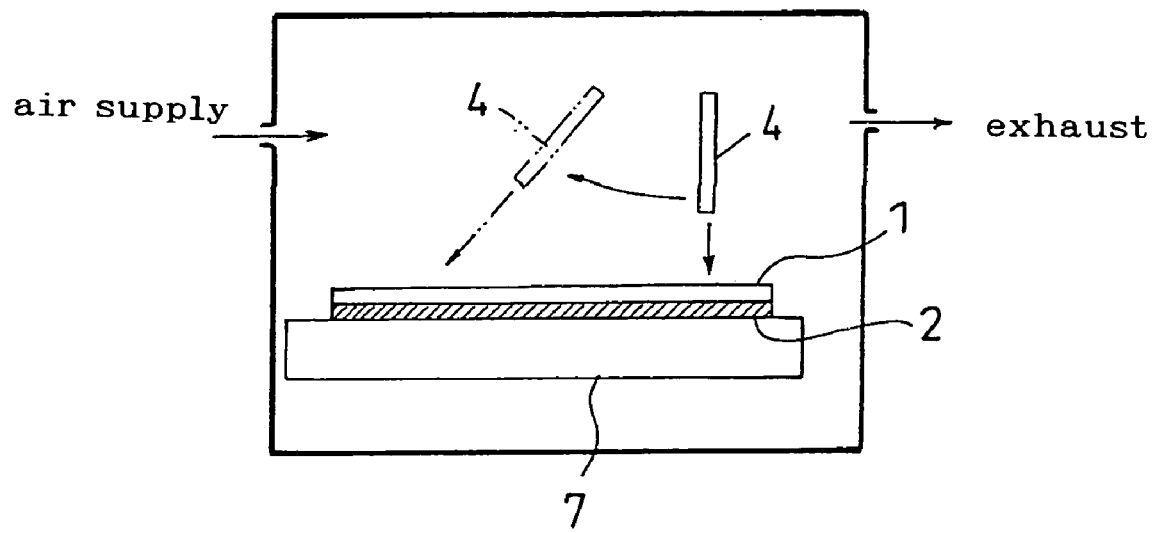
FIG. 3 is a descriptive view showing a third example construction of the dicing sheet adhering apparatus of the invention.

FIG. 3 is an example of a treatment by ozone of wafers, sheet-fed, related to the invention. In FIG. 3, a wafer 1, in a state where a back grinding tape 2 is not stuck thereon, is fixed to a chuck table 7. An ozone blowing nozzle 4 is mounted to a movable shaft so that a blowing direction is able to be directed to any position on the wafer 1 and ozone can be blown to across all of the surface by proper movement thereof. A treatment condition and take-out method are similar to those in Example 1.

Example 4

Figure 4:
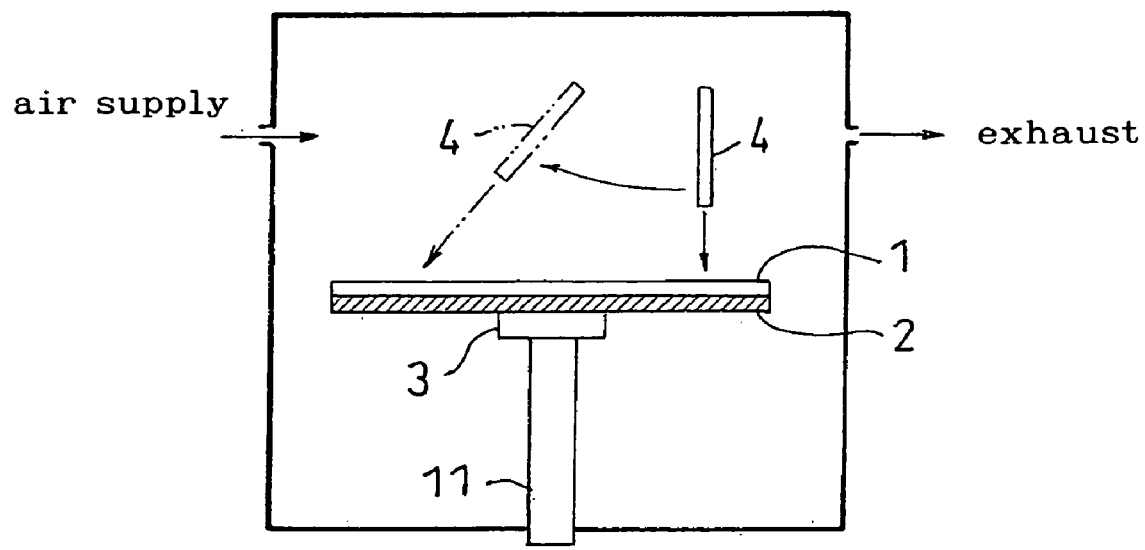
FIG. 4 is a descriptive view showing a fourth example construction of the dicing sheet adhering apparatus of the invention.

FIG. 4 is an example of a wafer back surface treating section of a dicing tape adhering apparatus related to the invention. This example is fundamentally similar to Example 1 except that no cleaning water is sprayed. An ozone blowing nozzle 4 is mounted to a movable shaft so that a blowing direction is able to be directed to any position on the wafer 1 and ozone can be blown to across all of the surface by proper movement thereof. It is usually desirable in order to decrease a space that an aligner is provided to a dicing tape adhering apparatus and an ozone blowing section is included in the aligner. A treatment condition and wafer handling are similar to those in Example 1.

Example 5

Figure 5:
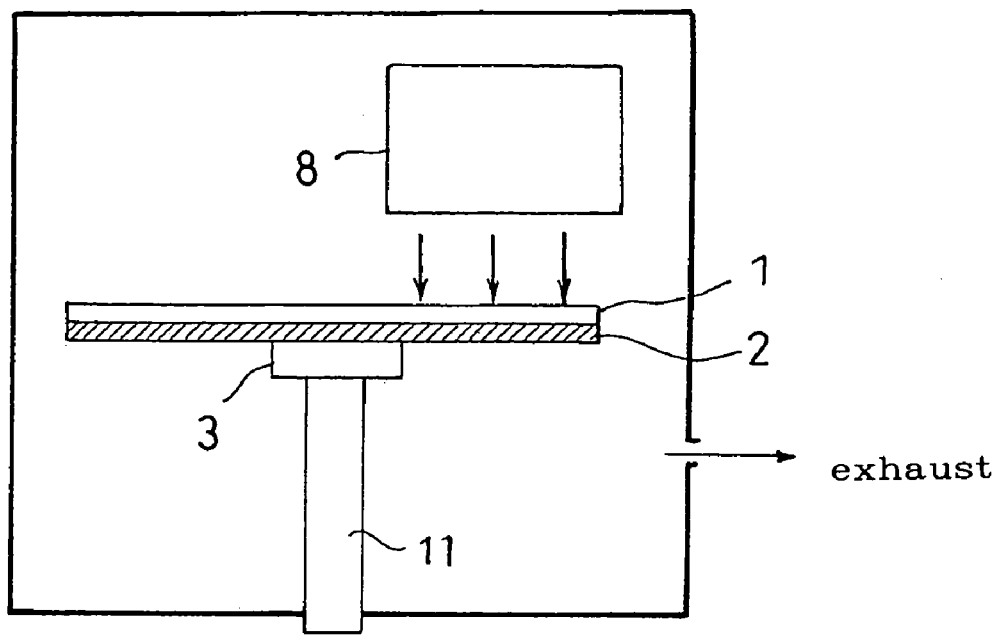
FIG. 5 is a descriptive view showing a fifth example construction of the dicing sheet adhering apparatus of the invention.

FIG. 5 is an example of a wafer back surface UV apparatus exhaust blowing section of a dicing tape adhering apparatus related to the invention. Since a blow supply is sufficient, it is preferable to provide the exhaust blowing section in the shape of a slit or covering all the surface thereof partly in order to increase a blowing amount. Since exhaust from the UV apparatus is usually at 10° C., the exhaust is preferable for increase in reactivity to that in a room temperature state in the vicinity of 23° C. On the other hand, if a wafer 1 is heated to a temperature of the order of 80° C. or higher, though differing according to a kind of a substrate, an inconvenience is apt to occur that a base member of a back grinding tape is generally softened to thereby bend a wafer or contracted to cause the back grinding tape to be released, therefore, a temperature of an object to be adhered is preferably controlled to a temperature of the order of 70° C. or lower by controlling a blowing amount with a separate blowing means.

Example 6

Figure 6:
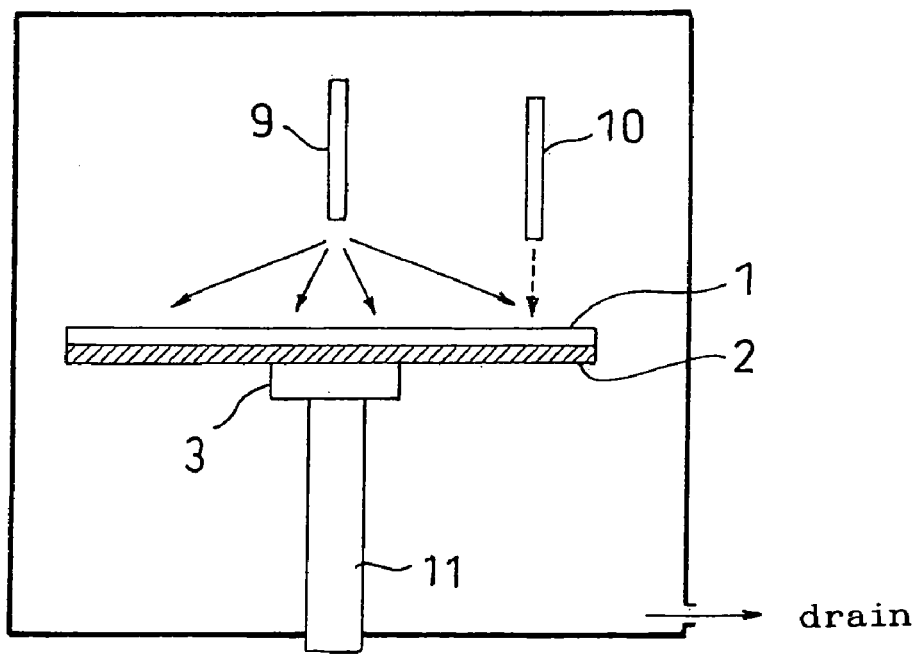
FIG. 6 is a descriptive view showing a sixth example construction of the dicing sheet adhering apparatus of the invention.

FIG. 6 is an example of a wafer back surface cleaning section of a grinding or polishing apparatus related to the invention. In FIG. 6, a wafer 1, in a state where a back grinding tape 2 remains stuck thereon, is fixed on a rotary shaft 11 by vacuum suction with a suction pad 3 interposed therebetween and sprayed with a cleaning water spraying nozzle 9 with ozone water while being rotated about the rotary shaft 11 and after cleaning, water is removed by an air blowing nozzle 10. Note that this example can be installed as an independent apparatus. Ozone water can be supplied from a general generator and an ozone concentration is preferably in the range of about 3 through 15 ppm. It is also possible to use hydrogen peroxide water instead of ozone water. Hydrogen peroxide water with a concentration of the order of 3% is usually used.

Comparative Example

A dicing tape was adhered and evaluation test was conducted without applying a deactivation treatment as described above.

<Test Results>

Results of the evaluation in the examples and comparative example described above are shown in Table 1.

TABLE 1

| Treatments | Concentrations (ppm) | Treatment Time (sec) | Sticking Force (N/cm) | Number of picking-up successes of all trials | Corresponding Examples |
|---|---|---|---|---|---|
| Ozone blowing | 0.3 | 21 | 1.8 | 20/20 | 1–4 |
| Ozone blowing | 7 | 7 | 1.6 | 20/20 | |
| Ozone water | 3 | 25 | 1.7 | 20/20 | 6 |
| Ozone water | 12 | 25 | 1.5 | 20/20 | |
| Hydrogen peroxide water | 3(%) | 25 | 1.5 | 20/20 | 1–4 |
| UV illumination mechanism exhaust | — | 30 | 2.0 | 20/20 | 5 |
| Without deactivation treatment | — | — | 2.7 | 13/20 | Comparative Example |

Back surfaces of chips that were able to be picked up were observed under an optical microscope with a magnification of 50×.

In a case where no deactivation treatment was applied, an adhesive left in a state of being coagulated and broken was recognized in a corner of a back surface of each of some chips but not all.

On the other hand, no adhesive was recognized being attached on back surfaces of chips having subjected to a deactivation treatment.

According to the invention, as described above, in a wafer after semiconductor circuits are formed thereon, by applying a deactivation treatment on a ground or polished surface of a semiconductor wafer activated in a grinding or polishing step, a sticking force between a dicing sheet and a back surface of the wafer is reduced, thereby enabling picking-up of semiconductor chips to be facilitated and in addition, contamination by the dicing sheet to be prevented.

With a deactivation treatment using an oxidizing agent applied, an unstable back surface of a wafer produced in grinding or polishing can be stabilized and deactivated in an arbitrary condition.

With a deactivation treatment by ozone blowing applied, an oxidation treatment on a ground or polished surface of a wafer can be carried out rapidly and uniformly in a dry condition.

With a deactivation treatment using ozone water applied, an oxidation treatment on ground or polished surfaces of plural wafers can be rapidly and uniformly carried out. In the treatment, a cleaning effect by ozone water is also exerted, which makes it possible to additionally work as a cleaning step.

With a deactivation treatment by UV illumination of a ground or polished surface of a wafer applied, an oxidation treatment on the ground or polished surface of a wafer can be carried out mildly and uniformly in a dry condition.

By adhering a dicing sheet to a back surface of a wafer in a state where a sticking force between the dicing sheet and the back surface of a wafer is reduced after a deactivation treatment described above, a treatment method of semiconductor parts can be provided, in which picking-up of semiconductor chips is facilitated and contamination by the dicing sheet is prevented.

In a dicing sheet adhering apparatus having a mechanism to blow ozone to a ground or polished surface of a wafer, by adhering a dicing sheet to a back surface of a wafer in a state where a sticking force between the dicing sheet and the back surface of a wafer is reduced after an oxidation treatment with ozone, a treatment apparatus of semiconductor parts can be provided, in which picking-up of semiconductor chips is facilitated and contamination by the dicing sheet is prevented. With ozone blowing applied, an oxidation treatment on a ground or polished surface of a wafer can be carried out rapidly and uniformly in a dry condition.

In a dicing sheet adhering apparatus having a UV illumination mechanism illuminating a UV-setting protective tape on a wafer surface and a mechanism to blow exhaust having cooled a UV lamp to a ground or polished surface of a wafer, an oxidation treatment on the ground or polished surface of a wafer is enabled without using an additional ozone generator and the exhaust is blown for a predetermined time, thereby enabling a very mild deactivation treatment to be effected.

What is claimed is:

1. A method for manufacturing a semiconductor device, comprising steps of:
   providing a semiconductor wafer having a ground or polished surface activated in a grinding or polishing step, with semiconductor circuits formed thereon;
   cleaning the ground or polished surface with water;
   after the cleaning step, deactivating the ground or polished surface by blowing ozone on the ground or polished surface of the semiconductor wafer;
   adhering a dicing sheet to the deactivated ground or polished surface of the semiconductor wafer thereafter; and dicing the dicing sheet-adhered wafer.

2. A wafer back surface treating method comprising steps of:
   providing a semiconductor wafer having a ground or polished surface activated in a grinding or polishing step, with semiconductor circuits formed thereon;
   deactivating the ground or polished surface by blowing ozone-containing exhaust gas from cooling a UV lamp to the ground or polished surface of the semiconductor wafer; and
   adhering a dicing sheet to the deactivated ground or polished surface of the semiconductor wafer.

* * * * *